United States Patent [19]

Aumiller et al.

[11] 4,127,699

[45] Nov. 28, 1978

[54] ELECTRICALLY CONDUCTIVE ADHESIVE

[75] Inventors: James H. Aumiller; Judith F. W. Becker, both of Wilmington, Del.

[73] Assignee: E. I. Du Pont de Nemours and Company, Wilmington, Del.

[21] Appl. No.: 885,171

[22] Filed: Mar. 10, 1978

Related U.S. Application Data

[63] Continuation of Ser. No. 689,388, May 24, 1976, abandoned.

[51] Int. Cl.$^2$ .................... C08K 3/04; C08K 3/08; C08K 3/14

[52] U.S. Cl. ................................. 428/461; 252/511; 252/514; 252/516; 260/42.22; 260/42.41; 260/42.46; 428/522; 428/523; 428/538; 428/539

[58] Field of Search .................. 252/511, 514, 516; 260/42.22, 42.41, 42.46; 428/461, 522, 523, 538, 539

[56] References Cited

U.S. PATENT DOCUMENTS

| | | | |
|---|---|---|---|
| 2,444,034 | 6/1948 | Cellings | 106/193 |
| 2,774,747 | 12/1956 | Wolfson et al. | 260/32.8 |
| 3,359,145 | 12/1967 | Salyer et al. | 156/1 |
| 3,639,121 | 1/1972 | York | 96/1.5 |
| 3,890,407 | 6/1975 | Briggs | 260/878 R |
| 3,912,668 | 10/1975 | Neumann | 260/42.22 |
| 3,932,311 | 1/1976 | Caldwell et al. | 252/514 |

*Primary Examiner*—James H. Derrington

[57] ABSTRACT

A curable adhesive composition comprising (i) a sulfur-bearing component selected from chlorosulfonated polyethylene and a mixture of a sulfonylchloride with chlorinated polyethylene, said sulfur-bearing component containing about 25 to 70 weight percent of chlorine and about 3 to 160 mmoles of sulfonyl chloride moiety per 100 g of chlorosulfonated or chlorinated polyethylene, said chlorosulfonated or chlorinated polyethylene being made from polyethylene having a melt index of about 4 to 500, (ii) at least one polymerizable vinyl monomer, and (iii) at least one member of the group of conductive particles selected from silver, carbon and titanium carbide in an amount which will produce an electrically conductive adhesive composition when cured; also disclosed are polymerization catalysts for the curable adhesive.

29 Claims, No Drawings

ELECTRICALLY CONDUCTIVE ADHESIVE

This is a continuation, of application Ser. No. 689,388, filed May 24, 1976, now abandoned.

BACKGROUND OF THE INVENTION

1. Field of the Invention

This invention concerns electrically conductive adhesive compositions which are derived from a sulfur-bearing component, a vinyl monomer, a catalyst and certain conductive particles.

2. Description of the Prior Art

Nonconductive adhesive compositions are well-known in the art. Such adhesives include those described in U.S. Pat. No. 3,890,407. Conductive adhesives are also known wherein metallic-conductive particles are added to otherwise nonconductive adhesive compositions which differ significantly from those of U.S. Pat. No. 3,890,407. Such conductive adhesives have generally been commercially unsuccessful because of deficiencies in one or more of the following properties (which serve to characterize the novel compositions of this invention): both aerobic and anaerobic room temperature cure, nonrigid, high strength bonding, low electrical resistivity, good shelf life, utility over a wide temperature range, unaffected by moisture or salts, and applicability to water or oil-wet surfaces.

SUMMARY OF THE INVENTION

This invention concerns a curable adhesive composition comprising (i) a sulfur-bearing component selected from chlorosulfonated polyethylene and a mixture of a sulfonylchloride with chlorinated polyethylene, said sulfur-bearing component containing about 25 to 70 weight percent of chlorine and about 3 to 160 mmoles of sulfonyl chloride moiety per 100 g of chlorosulfonated or chlorinated polyethylene, said chlorosulfonated or chlorinated polyethylene being made from polyethylene having a melt index of about 4 to 500, (ii) at least one polymerizable vinyl monomer, and (iii) at least one member of the group of conductive particles selected from silver, carbon and titanium carbide in an amount which will produce an electrically conductive adhesive composition when cured.

The "adhesive compositions" of this invention include the above-described composition in the curable (uncured) and in the cured states. The adhesive compositions are cured by polymerization catalysts, i.e., ingredient (iv). The catalysts can form one package of a two-package system wherein the other package consists of components (i), (ii) and (iii). However, regardless of how the ingredients are packaged, the invention includes the following three basic compositions: (1) (i), (ii) and (iii) in the curable state without the presence of catalyst; (2) (i), (ii), (iii), and (iv) in the curable state, i.e., wherein the catalyst is maintained separate from (i), (ii) and (iii); and (3) (i), (ii), (iii) and (iv) in the cured (polymerized) state. The curable compositions of this invention have shelf lives of up to about 6 months or more under ambient conditions.

The relative proportions of chlorosulfonated polyethylene and polymerizable vinyl monomer can vary within a rather broad range. In the case of acrylic polymers, the practical range is about 25 to 2,000 parts by weight of the monomer per 100 parts of chlorosulfonated or chlorinated polyethylene. The preferred range is 50 to 500 parts by weight of the monomer per 100 parts of polymer, whether chlorosulfonated polyethylene or a mixture of a sulfonyl chloride and chlorinated polyethylene is used.

Additional details concerning the sulfur-bearing component, the vinyl monomer and the catalyst can be found in coassigned U.S. Pat. No. 3,890,407 which is summarized below and which is incorporated herein by reference.

DETAILS OF THE INVENTION

The Sulfur-Bearing Component (i)

The chlorosulfonated polyethylene useful in the present invention can be prepared in a manner well known to those skilled in the art by reaction of linear or branched polyethylene and a sulfuryl chloride, $SO_2Cl_2$, or sulfur dioxide and chlorine. Chlorosulfonated polyethylene is also available commercially, for example, under the trade name Hypalon ®. In practice, the chlorosulfonated polyethylene can be a chlorosulfonated copolymer of ethylene with small proportions of propylene or other olefins. Various chlorosulfonated polyethylenes and methods of their preparation are discussed in coassigned U.S. Pat. No. 2,982,759, which is incorporated herein by reference.

Alternatively, a mixture of a sulfonyl chloride and chlorinated polyethylene can be used. The sulfonyl chlorides can be mono- or poly-functional sulfonyl chlorides having 1 to 24 carbon atoms and 1 to 2 chlorosulfonyl groups, for instance, $C_1$ to $C_{12}$ alkyl sulfonyl chlorides, such as methane and butane sulfonyl chloride; and $C_6$ to $C_{24}$ aromatic sulfonyl chlorides such as benzene or toluene sulfonyl chloride; and sulfonyl chlorides containing hetero atoms such as diphenylether-4,4'-disulfonyl chloride.

The Vinyl Monomer (ii)

Contemplated polymerizable vinyl monomers include acrylic monomers and mixtures of monomers, such as methyl methacrylate, ethyl methacrylate, acrylonitrile, methacrylonitrile, methyl acrylate, ethyl acrylate, butyl methacrylate, cyclohexyl methacrylate, hexyl methacrylate, 2-ethylhexyl methacrylate, lauryl methacrylate, butyl acrylate, cyclohexyl acrylate, hexyl acrylate, 2-ethylhexyl acrylate, lauryl acrylate, methacrylic acid, acrylic acid, glycidyl methacrylate, itaconic acid, ethylene glycol and higher-glycol acrylates and methacrylates, acrylamide, and methacrylamide; halogenated monomers such as vinylidene chloride, chlorostyrene, 2,3-dichloro-1,3-butadiene, and 2-chloro-1,3-butadiene; and styrene and mono- and poly-alkylstyrenes, such as methylstyrene, dimethylstyrene, ethylstyrene, or tert-butylstyrene. The preferred monomers are acrylic monomers, especially lower alkyl acrylates and methacrylates and ethylene glycol diacrylate and dimethacrylate.

The Particles (iii)

Contemplated particles are conductive and include metallic-conductive silver and TiC particles. The contemplated particles also include conductive carbons which generally have low levels of volatile materials present therewith. These three types of particles are preferred to herein as "conductive" for the sake of simplicity.

Also contemplated to be used herein are carrier particles which are coated with silver, carbon or TiC. Silver is generally more conductive than TiC and carbon. For this latter reason, the preferred conductive particles are silver. The most preferred form of the silver is a flake form. However, for bonding aluminum or iron, compositions containing silver particles tend to give bonds whose resistivity increases with time. Therefore, TiC particles and carbon particles are preferred for these substrates.

The particles used in the invention composition do not act to any significant degree to catalyze the polymerization of the monomers which are employed in the curable state. It has been found that certain conductive particles such as copper catalyze the polymerization of the monomer component. Since such metal catalyzation will adversely affect shelf-life, the use of such particles (copper and others) should be avoided.

The amounts of particles useful in the conductive adhesive compositions of this invention depend, among other things, upon the size and the conductivity of the particles being contemplated. For instance, with TiC particles, the ratio by weight of the particles to the balance of the composition is typically about 4:1 to 6:1. For silver particles, the ratio by weight is typically about 1:1 to 5:1. For carbon particles, the ratio is typically about 0.20:1 to 0.35:1. The lower limit is that below which the composition tends to show uncharacteristically high resistivities for that type of particle employed. The upper limit is a practical limit above which overall adhesive characteristics begin to deteriorate.

As noted above, the amounts of particles can vary depending upon at least the two factors of particle size and conductivity. Average means diameters of regular commercial grades of carbon, silver and TiC particles are given below. Significantly smaller or larger particle sizes than those which are given may require lesser or greater amounts, respectively, of the particles than the amounts stated above as typical. For example, the mean diameter of useful carbon particles can be about 0.04 to 10 $\mu M$, that of silver particles can be about 0.1 to 50 $\mu M$, and that of TiC particles can be about 0.1 to 50 $\mu M$.

The Catalyst (iv)

Operable catalysts and catalyst amounts will readily suggest themselves to those skilled in the art with a minimum of experimentation. It will be readily appreciated what catalysts will be effective to facilitate polymerization of the composition within a reasonable time. Contemplated catalysts can be selected from one or more of the following compounds which are representative of the wide variety of operable catalysts.

Amine-containing catalysts can be employed; for example: N,N-dimethylaniline, N,N-dimethyltoluidine, N,N-diethylaniline, N,N-diisopropyl(p-toluidine) or a guanidine.

Transition metal compounds can be used which provide transition metal ions; for example: cobalt, nickel, manganese, or iron naphthenate, copper octoate, iron hexoate, or iron propionate.

Various aldehyde and amine condensation products are useful as catalysts. The aldehydes will preferably be aliphatic aldehydes having 1 to 12 carbon atoms. Any primary aliphatic or aromatic amine having up to about 18 carbon atoms is suitable. Typical aldehydes include acetaldehyde, butyraldehyde, propionaldehyde, cyclopentanal, hexanal, cyclohexanal, hydrocinnamaldehydes, heptanal, decanal, and dodecanal. Typical amines include ethylamine, butylamine, pentylamine, cyclopentylamine, hexylamine, cyclohexylamine, octylamine, decylamine, dodecylamine, hexadecylamine, octadecylamine, aniline, tolyl amines, and xylyl amines. In both the aldehyde and the amine series, various position isomers are possible. The most preferred catalyst of this invention is a condensation product of butyraldehyde and aniline.

Free-radical generating catalysts such as organic peroxides and hydroperoxides, peresters and peracids are well-known to those skilled in the art. See, for example: "Free Radicals in Solution," C. Walling, J. Wiley & Sons, New York, 1957, and in "The Chemistry of Organic Film Formers," D. H. Solomon, J. Wiley & Sons, New York, 1967, p. 135 ff.

Utility

Curing (bonding) of the adhesive composition of this invention can be accomplished in two ways. For curing relatively large quantities of polymer/monomer/particle component of thick cross-section, the catalyst can be mixed therewith at the rate of, say, 2% or 3% of catalyst by weight of said component. The adhesive is then applied and held in place during set time which is usually 1 to 5 minutes. For curing thin sections, a thin coating of catalyst can be applied, say, to the two surfaces which are to be bonded. Then, the polymer/monomer/particle component is applied to each surface and the surfaces are held together until set, usually 3 to 8 minutes.

For best results, joining of the articles to be bonded with an adhesive of this invention should proceed quickly after the catalyst and the polymer/monomer/particle component are contacted with one another. If polymerization is allowed to proceed too far toward completion before the articles are attempted to be joined, the bond itself will exhibit a greater electrical resistance than bonds made by prompt joining after contact (including mixing) of the catalyst with the polymer/monomer/particle component. Of course, polymerization should not be allowed to proceed so far that subsequent bonding may be adversely affected.

The compositions of this invention are useful as terminal board connections and solderless electrical bonds. There is also utility in the electronic industry where connections having integrity must be made without the use of mechanical force or heat, e.g., in integrated circuits and liquid crystal displays. Various electrical conductors can be joined by the adhesive composition of this invention, including copper, brass, silver, aluminum and iron.

The adhesive composition of this invention will have utility for forming intricate conductive patterns over large areas. Physical damage to said conductive pattern can then be detected by sensing increased resistance of said pattern as a whole and, in fact, the location of the portion of the pattern subjected to physical damage can be pinpointed. For example, a conductive pattern can be applied by silk-screening a mixture of polymer/monomer/particles, thinned to the desired consistency with, say, methylmethacrylate, to polymethylmethacrylate or polystyrene plastic. Then, the mixture on the plastic surface can be coated with a thin film of polymerization catalyst to induce curing. The plastic coated with the nonrigid conductive pattern can then be molded around the undercarriage of a helicopter. If said helicopter is hit and penetrated by ground fire, a portion of the conductive pattern will be broken and a signal reflecting the pattern's change of resistance will be generated to indicate that the helicopter is hit and where it is hit.

Lap sheer strengths obtained according to ASTM D-1002-64 have been found to provide a useful means for determining the degree of particle loading that can be effected. Generally, higher lap sheer strengths are obtainable at lower particle loadings. One skilled in the art desiring a bond of a certain strength (lap sheer strength) and conductivity will be able to determine the type and amount of conductive particles to employ without undue experimentation.

The following Examples illustrate the invention. All parts are by weight unless otherwise noted. Resistance values were determined by means of a Triplett Ohmmeter (unless otherwise noted) on bonded articles having a thickness of adhesive composition of about 25 mils. Resistances were determined at ambient temperatures.

EXAMPLE 1

To a mixture of acrylic monomers comprising 678 g of 2-ethylhexyl methacrylate (containing 50 to 90 ppm of hydroquinone inhibitor), 22 g of glacial methacrylic acid (containing 250 ppm of 4-methoxyphenol), and 11 g of ethylene glycol dimethacrylate, there was added 400 g of chlorosulfonated polyethylene (Hypalon ® 20 Synthetic Rubber) made from branched polyethylene having a melt index of 10 and containing 29 percent chlorine and 1.4 percent sulfur. The mixture was rolled in a container at room temperature until solution of the polymer was complete. To a portion thereof was added in turn, with stirring, 0.5 percent by weight of cumene hydroperoxide and 6 g of titanium carbide powder (20 microns average particle size) per gram of solution.

Several one-inch square pieces of aluminum sheet were primed on one surface with a commercial butyraldehydeaniline condensation product available as "808 ® Accelerator" from E. I. du Pont de Nemours & Co. The curable adhesive composition was then applied between two facing primed aluminum surfaces. The adhesive set within 15 minutes at room temperature and the resistance was determined to be about 300 ohms. Another amount of curable adhesive composition was then applied in the same way between facing primed aluminum surfaces. The resistance of the cured adhesive was determined to be 200,000 ohms.

EXAMPLE 2

A mixture was prepared as in Example 1 except that replacing the 2-ethylhexyl methacrylate as monomer was methyl methacrylate similarly inhibited with hydroquinone, the resultant percentages by weight of components in the rolled solution being 36.8% Hypalon ® 20 Synthetic Rubber, 51.65% methyl methacrylate, 10.5% glacial methacrylic acid, and 1.05% ethylene glycol dimethacrylate.

The preparation of conductive adhesive compositions was made without addition of cumene hydroperoxide. Portions of the rolled solution were loaded respectively with 5, 4, 3, and 2 parts of finely divided silver powder per part of solution. This powder contained at minimum 99.1% Ag, at maximum 0.02% chlorides, and is available as Du Pont Conductive Silver 4569.

Each solution into which silver powder has been stirred was applied as in Example 1 between 808 ® Accelerator-primed aluminum pieces. Each set within 15 minutes and curing continued for 40 minutes altogether at which time electrical resistances and lap sheer strengths between the bonded pieces were measured. Resistances were <1 ohm for the 5, 4, and 3-part Ag bonds and 1000 ohms for the 2-part Ag bond. Lap sheer strengths of the 2- and 3-part Ag bonds were greater than 1000 psi, and were 2 to 3 times greater than the 4- and 5-part Ag bonds.

EXAMPLE 3

A conductive adhesive composition was prepared from the rolled solution of Example 2 by adding 3 parts of finely divided conductive silver flake per part of solution by weight, the flake-form silver containing at minimum 98.8% Ag and at maximum 0.02% chlorides (Du Pont Conductive Silver 3032).

The composition was applied and allowed to cure for 1 hour between pairs of 808 ® Accelerator-primed copper. The resistance was less than a milliohm as measured with a Keithley Model 502 Milliohmmeter on a bonded article having a thickness of adhesive composition of about 25 mils.

EXAMPLE 4

A conductive adhesive composition was prepared from the rolled solution of Example 2 by adding 3 g of conductive glass beads per gram of the solution. The glass beads were obtained from Potters Bros. Co., Carlstadt, N.J. as beads 3000-S3 of about 5 to 40 microns in diameter. The beads were coated with 12% of the silver by weight of the beads. The composition was applied and set within 15 minutes to form a rubbery bonding layer of 1 ohm resistance between 808 ® Accelerator-primed aluminum surfaces.

EXAMPLE 5

A conductive adhesive composition was prepared from the rolled solution of Example 2 by stirring 0.25 g of acetylene carbon black into 1.0 gram of the solution. The composition was applied and allowed to cure for one-half hour between 808 ® Accelerator-primed aluminum pieces at which time the resistance between the bonded pieces was 1000 ohms.

EXAMPLE 6

The procedure of Example 5 was duplicated with the exception that 0.35 gram of acetylene carbon black was employed. The resistance was 300 ohms.

EXAMPLES 7 TO 17

Ten portions of the rolled solution of Example 2 were loaded with 1.1 to 2.0 parts (in increments of 0.1) of the finely divided silver powder of Example 2 and an 11 portion was loaded with 3.0 parts of the same silver powder per part of solution.

Each solution into which silver powder had been stirred was used to slightly overfill a separate 7/32-inch diameter hole in a 3/32-inch thick phenolic circuit board backed by a copper plate. Separate ¼-inch copper discs punched out of 1/32-inch thick copper sheet were then primed with 808 ® Accelerator and pressed over each hole, squeezing out a slight excess of solution. The curable adhesive solution in each hole set within 15 minutes at room temperature to form eleven copper-electroded articles bonded with adhesive compositions of this invention. The following resistances were then measured between each copper disc and the copper backing plate. The resistance of the material of Example 17 was measured with a Keithley Model 502 Milliohmmeter.

| Example No. | Parts Silver Per Part Adhesive | Resistance (ohms) |
| --- | --- | --- |
| 7 | 1.1 | 8.3 |
| 8 | 1.2 | 24.5 |
| 9 | 1.3 | 3.9 |
| 10 | 1.4 | 0.88 |
| 11 | 1.5 | 0.55 |
| 12 | 1.6 | 0.59 |
| 13 | 1.7 | 0.1 |
| 14 | 1.8 | 0.3 |
| 15 | 1.9 | 0.1 |
| 16 | 2.0 | 1.8 |
| 17 | 3.0 | 0.03 |

The embodiments of the invention in which an exclusive property or privilege is claimed are defined as follows:

1. A curable adhesive composition comprising (i) a sulfur-bearing component selected from chlorosulfonated polyethylene and a mixture of a sulfonylchloride with chlorinated polyethylene, said sulfur-bearing component containing about 25 to 70 weight percent of chlorine and about 3 to 160 mmoles of sulfonyl chloride moiety per 100 g of chlorosulfonated or chlorinated polyethylene, said chlorosulfonated or chlorinated polyethylene being made from polyethylene having a melt index of about 4 to 500, (ii) at least one polymerizable vinyl monomer, and (iii) at least one member of the group of conductive particles selected from silver, carbon and titanium carbide in an amount which will produce an electrically conductive adhesive composition when cured.

2. The composition of claim 1 wherein the sulfur-bearing component is chlorosulfonated polyethylene.

3. The composition of claim 1 wherein the sulfur-bearing component is a mixture of a sulfonyl chloride with chlorinated polyethylene.

4. The composition of claim 2 wherein the proportion of chlorosulfonated polyethylene to vinyl monomer is about 4 to 1 to 1 to 20 by weight.

5. The composition of claim 4 wherein the vinyl monomer is an acrylic monomer.

6. The composition of claim 5 wherein the conductive particles are silver particles.

7. The composition of claim 5 wherein the conductive particles are TiC particles.

8. The composition of claim 5 wherein the conductive particles are carbon particles.

9. The composition of claim 1 including (iv) a polymerization catalyst.

10. The composition of claim 9 wherein the sulfur-bearing component is chlorosulfonated polyethylene.

11. The composition of claim 9 wherein the sulfur-bearing component is a mixture of a sulfonyl chloride with chlorinated polyethylene.

12. The composition of claim 10 wherein the proportion of chlorosulfonated polyethylene to vinyl monomer is about 4 to 1 to 1 to 20 by weight.

13. The composition of claim 12 wherein the vinyl monomer is an acrylic monomer.

14. The composition of claim 13 wherein the vinyl monomer is alkylmethacrylate.

15. The composition of claim 14 wherein the vinyl monomer is methylmethacrylate.

16. The composition of claim 14 wherein the conductive particles are silver.

17. The composition of claim 14 wherein the conductive particles are TiC.

18. The composition of claim 14 wherein the conductive particles are carbon.

19. The composition of claim 15 wherein the conductive particles are silver.

20. The composition of claim 15 wherein the conductive particles are TiC.

21. The composition of claim 15 wherein the conductive particles are carbon.

22. The composition of claim 15 wherein the catalyst is a condensation product of butyraldehyde and aniline.

23. Articles bonded with the adhesive composition of claim 9.

24. The composition of claim 3 wherein the proportion of said mixture to vinyl monomer is about 4 to 1 to 1 to 20 by weight.

25. The composition of claim 11 wherein the proportion of said mixture to vinyl monomer is about 4 to 1 to 1 to 20 by weight.

26. Articles bonded with the adhesive composition of claim 10.

27. Articles bonded with the adhesive composition of claim 11.

28. Articles bonded with the adhesive composition of claim 12.

29. Articles bonded with the adhesive composition of claim 25.

* * * * *